Oct. 6, 1964 B. M. TORREY 3,151,398

BENDING APPARATUS

Filed March 5, 1962

INVENTOR.
BRADFORD M. TORREY

BY [signature]
[signature]

ATTORNEYS

United States Patent Office 3,151,398
Patented Oct. 6, 1964

3,151,398
BENDING APPARATUS

Bradford M. Torrey, Carlisle, Mass., assignor to Automation Incorporated, Wellesley Hills, Mass., a corporation of Massachusetts Filed Mar. 5, 1962, Ser. No. 177,655
8 Claims. (Cl. 33—143)

This invention relates to bending devices, and more particularly to apparatus for providing bending coordinates, in accordance with which, leads of an axial lead component can be bent in said apparatus in order to be accurately mounted with respect to a pair of mounting points.

In industrial assembly work, particularly the electronics industry, components are employed which are provided with a pair of substantially colinear support elements, such as wires, which extend in opposite directions to one another from opposite sides of the component. These electrical components are almost always supplied from the manufacturer with precisely controlled lead dimensions, end-to-end and end to component.

Typical examples of such components are resistors, capacitors, inductances, diodes and the like, and their respective associated pairs of leads. The leads can function as both conductors of electrical signals and as physical supports. Many such components are used frequently in conjunction with a mounting element or circuit board, often of the printed circuit type, as well as with standard chassis. In instances where the components are to be mounted on prototype or short-run circuit boards, the task of bending the leads to conform to the board configuration, and specifically to pre-established or predrilled mounting points or holes, is time-consuming and onerous. It is usually desired to mount the components in a relatively uniform plane substantially parallel to the board. This is done by bending the leads approximately perpendicularly to their normal common axis. Depending upon the length of the lead and the axial dimension of the component, if a lead is bent at the wrong point, the component will not readily mount without distorting the perpendicularity of the lead, causing non-parallelism of the component with respect to the board, and destroying the uniformity of separation of the components from the board. If the board and the components mounted thereon is intended to be racked in a limited space, the coplanarity of the components contributes to proper fit with respect to the space. Often, an incorrectly bent lead means either time wasted in straightening and rebending the lead, or may result in discarding an expensive component.

The present invention, therefore, has as its principal object the provision of an apparatus for providing bend coordinates based upon lead length, the axial dimension of a component (the distance between the points of attachment of the two leads to the component) and the distance between two preset mounting points to which respective leads of the component are intended to be attached. By use of said apparatus these coordinates can be obtained and applied directly to a component lead. Thus, the lead, while in the apparatus, can be bent at the proper points, thereby insuring that when both leads have been bent through substantially right angles, the separation between the leads allows a precise fit with respect to the mounting points.

Other objects of the present invention will in part be obvious and will in part appear hereinafter.

The invention accordingly comprises the apparatus possessing the construction, combination of elements, and arrangements of parts which are exemplified in the following detailed disclosure, and the scope of the application of which will be indicated in the claims.

For a fuller understanding of the nature and objects of the invention, reference should be had to the following detailed description taken in connection with the accompanying drawings in which.

The present invention generally comprises a mounting means which is preferably adapted to be hand-held and which is intended to provide a support for the elements of the apparatus. Mounted on the mounting means is a longitudinal element having an opening such as a cylindrical hole extending longitudinally thereof. The opening is preferably so dimensioned that a lead is insertable therein for the full length of the latter. The longitudinal element is movable with respect to the mounting means substantially along the longitudinal axis of the opening. The apparatus of the invention also includes adjustable means positionable in accordance with measurements made of both the axial dimension of a component, the distance between the mounting points, or both. Coupled to the adjustable means and positionable in accordance therewith are means for limiting the longitudinal dimension of the opening in the longitudinal means and thereby limiting the length of lead which can be inserted in the opening. By thus limiting the length of lead, a point is established at which the lead is to be bent in accordance with the measurements made.

Figure 1:
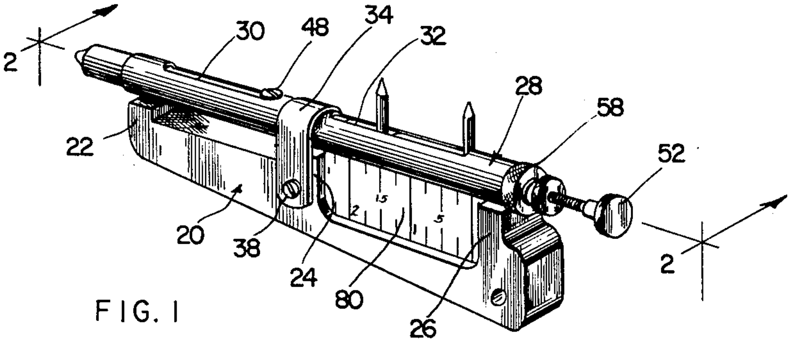
FIG. 1 is a perspective view of the one embodiment of the invention.

Referring now to the drawing there will be seen in FIG. 1 a perspective view of a preferred embodiment of the present invention comprising support means such as a handle 20. Handle 20 is preferably an elongated element adapted to be hand-held and includes a first transverse projection or mount 22 adjacent one end thereof, a second transverse projection or mount 24 adjacent the other end thereof, and a third transverse projection or mount 26 intermediate the ends of the element. All of these mounts extend in the same direction from the body of handle 20 in substantially the same plane. Supported on all three mounts is a tubular element or receiver 28 having a pair of guide means such as elongated slots 30 and 32 formed therein respectively adjacent opposite ends of the receiver. The slots both extend through the wall of the receiver from the exterior to the interior thereof, the longitudinal axes of both slots being substantially parallel to the longitudinal axis of the receiver. Means are provided, in the form of clamp 34, for holding receiver 28 upon mounts 22, 24 and 26, and for restraining the receiver in this position so that the latter is movable, with respect to handle 20, only in rotation about its longitudinal axis.

Figure 2:
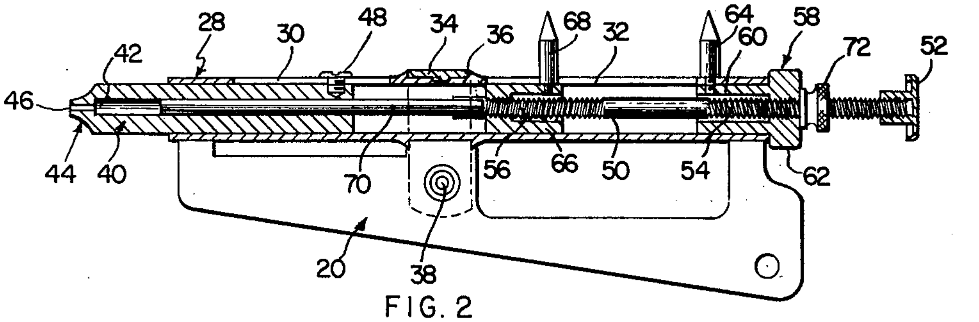
FIG. 2 is an elevational view in section taken along the line 2—2 of the embodiment of FIG. 2.

Clamp 34 is in the form of a clevis, the bight of which is dimensioned to fit snugly within guide channel 36 grooved circumferentially about the exterior of a portion of receiver 28 intermediate slots 30 and 32, as will be seen in FIG. 2. The extremities of clamp 34 are fastened to handle 20 on opposite sides thereof by clevis pin 38 which extends through the handle.

Disposed within a first end of receiver 28 is an elongated cannulate element, such as bending chuck 40, for holding a component lead. An opening such as cylindrical passage 42 extends substantially centrally and from end to end of chuck 40 along the longitudinal axis thereof. In the form shown, chuck 40 is uniformly cylindrical in shape, being externally dimensioned to fit snugly but slideably within the one end of receiver 28. Chuck 40 includes at one end thereof a bending portion or tip 44 which provides a fulcrum at which a lead may be bent. Tip 44 is shown in the shape of a truncated cone having a perforation 46 along its conical axis and disposed so that the perforation is coaxial with passage 42. Although tip 44 is shown in the drawing as forming an integral part of chuck 40, it may also be provided as a removable structure so that a variety of tips of other shape or with perforations of other diameters can be employed with the same apparatus.

Means are provided for limiting the extent of slideable motion of chuck 40 along its longitudinal axis within the receiver. In the form shown, such means comprises lock screw 48 tapped into the body of chuck 40 adjacent to the end of the latter opposite to tip 44. Screw 48 extends normally to the longitudinal axis of the chuck. When chuck 40 is operatively positioned within receiver 28, lock screw 48 is confined by the body and head thereof within slot 30. The extent of the sliding motion of chuck 40 is thus limited by engagement of the body of lock screw 48 with the ends of slot 30. Chuck 40 can be rendered immobile with respect to the receiver by tightening lock screw 48 until the screw head engages the receiver along the sides of slot 30. Lock screw 48 is so positioned and slot 30 and chuck 40 are so dimensioned that upon engagement of the body of the lock screw with either end of slot 30, at least tip 44 extends outwardly of the first end of receiver 28.

Disposed within the other or second end of receiver 28 are measuring means for determining the axial dimension of a component, for determining the distance between mounting points, or both, at least a portion of the measuring means being positionable responsively to the determinations thus made. In the form shown, the measuring means comprises an elongated and adjusting screw 50, a portion of which extends outwardly of the second end of the receiver. A manually operable element, such as knurled thumb nut 52 is so fixedly mounted on the extremity of this latter portion that rotation of the thumb nut rotates adjusting screw 50 about its longitudinal axis. Part 54 of adjusting screw 50 adjacent thumb nut 52 is threaded in one direction, for instance as a righthand thread, while another part 56 of adjusting screw 50, for instance adjacent to the opposite extremity thereof, is threaded in the opposite sense, for instance as a lefthand thread. The threads of both parts are preferably equally pitched. The adjusting screw is therefore of the differential type.

Means such as fixed nut 58 are provided for supporting adjusting screw 50 to provide advancement or retreat of the body of the screw upon rotation of the latter. To this end, fixed nut 58 comprises a cylindrical body 60, axially drilled and internally threaded so that the threads of part 54 are in engagement with the internal threading of body 60. Body 60 is preferably externally dimensioned to fit tightly within the second end of receiver 28 and may even be formed as an integral part thereof. In the form shown, however, fixed nut 58 includes a cylindrical flange or head 62 which is of substantially greater diameter than body 60 which is adapted to abut the other end of the receiver in fixed relation thereto. Attached to or forming an integral part of fixed nut 58 at the opposite end thereof from flange 62 is an elongated element such as trammel point 64. Trammel point 64, in the form shown, is a cylindrical element having a conical point at one end thereof. Trammel point 64 is attached to fixed nut 58 so that the longitudinal axis of the trammel point is substantially perpendicular to the bore of fixed nut 58, and the trammel point extends outwardly of slot 32 at that end of the latter located adjacent to the second end of the receiver.

Mounted within the interior of and movable along the axis of receiver 28 responsively to rotation of adjusting screw 50 is another portion, such as movable traveling nut 66, of the measuring means. Nut 66 is also a substantially cylindrical element externally dimensioned to slide freely with the receiver and internally drilled and threaded. When in operative relation to the apparatus of the invention, traveling nut 66 rides upon and is in threaded engagement with part 56 of the adjusting screw. Nut 66 has attached thereto or forming an integral part thereof another measuring element or trammel point 68, the latter being formed and disposed with respect to nut 66 in the manner heretofore described in connection with trammel point 64 and its relation to nut 58. Trammel point 68 also extends through slot 32 and is thereby movable along slot 32 toward and away from trammel point 64 responsively to the travel of nut 66. It will be apparent that nut 66 is restrained from rotating in either direction with rotation of adjusting screw 50 because of the engagement of trammel point 68 with the respective sides of slot 32.

Any measurement of distance determined by the location of the tips of the trammel points will be accompanied by a corresponding positioning of adjusting screw 50 with respect to the longitudinal axis of the receiver. Means are therefore provided, responsive to the positioning of adjusting screw 50, for limiting the longitudinal dimension or depth of passage 42. Such means, in the form shown, comprises a simple rod 70 having one end thereof slideably disposed within a portion of passage 42. The other end of rod 70 is coupled with adjusting screw 50, the axes of both rod and screw being substantially colinear. For the sake of simplicity in constructing the apparatus, rod 70 of course can be formed as an integral, unthreaded part of adjusting screw 50. Rod 70 is preferably shaped and dimensioned to conform to the cross-section of passage 42 for effectively obstructing the latter. The rod extends from adjusting screw 50 to chuck 40 so as to protrude into passage 42 at the end of the latter opposite to tip 44.

Means, in the form of a simple lock nut 72, are provided for releasably locking adjusting screw 50 so that it cannot be rotated and thereby change the relative positioning of the elements of the invention to each other. Lock nut 72 is preferably internally threaded and rotatable about that portion of part 54 lying between fixed nut 58 and thumb nut 52.

Figures 3, 4, 5, 6:
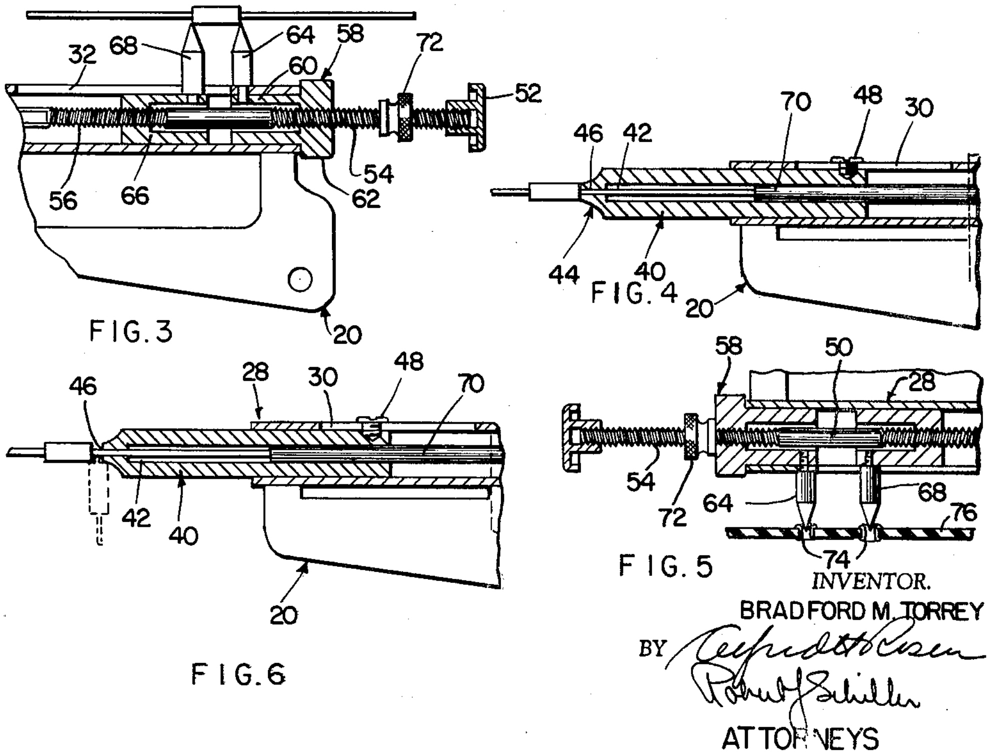
FIG. 3 is a fragmentary view of a portion of FIG. 2 showing the apparatus in use for determining the axial dimension of a component.
FIG. 4 is a fragmentary view of another portion of FIG. 2 showing one lead of a component held in the apparatus after measurement of the component.
FIG. 5 is yet another fragmentary view of FIG. 2 showing the apparatus in use measuring the distance between mounting points.
FIG. 6 is a fragmentary view of FIG. 2 showing the positioning of the parts of the embodiment, with respect to the component and its lead, following measurement of the component and of the distance between the mounting points.

The operation of the invention is shown in detail in FIGURES 3 and 6 inclusive. The operator of the device, by grasping thumb nut 52 rotates adjusting screw 50. Of course, this requires that lock nut 72 is not bound against fixed nut 58 and has been backed off. Upon rotation of adjusting screw 50, traveling nut 66 is moved along the axis of the receiver in a direction which depends upon the rotation of adjusting screw. It will be seen that the travel of nut 66 is always in the same direction as that of rod 70 and, when the thread of parts 54 and 56 of the adjusting screw are identical but in opposite sense to one another, the travel of nut 66 is double that of rod 70. The operator places one end of a component against the extremity of trammel point 64 and rotates thumb nut 52 in the proper direction to cause trammel point 68 to travel to a position at the other end of the component as shown in FIG. 3. This positioning of the trammel points sets the position of rod 70 with respect to the interior of the receiver. Lock screw 48 is then loosened. An axial lead of the component is inserted in passage 42 and the position of chuck 40 with respect to the received is then adjusted by sliding the chuck in the proper direction to insure that the end of the lead abuts the tip of rod 70 when tip 44 abuts the component. Lock screw 48 is then tightened to preserve the position of chuck 40 with respect to receiver 28 as shown in FIG. 4.

Next, the adjusting screw is again rotated to move trammel point 68 with respect to trammel point 64 until the two trammel points measure or gauge, preferably by direct comparison, the distance between mounting points such as holes 74 shown in workpiece 76 in FIG. 5. Responsively to the measurement by the trammel points of the distance between holes 74, and because the distance between the mounting points is, in the electronic industry at least, invariably equal to or greater than the axial dimension of the electronic component, it will be apparent that rod 70 has moved with adjusting screw 50 along passage 42 so as to reduce the depth thereof by a distance which is, in the embodiment described, half of the difference between the two measurements made by trammel points. Once the trammel points are set in accordance with the distance between holes 74, lock nut 72 may be rotated into binding engagement with fixed nut 58 thereby locking the adjusting screw to preserve a precise positional relationship between rod 70 annd chuck 40. Lastly, the lead of the component in question may be reinserted through perforation 36 into passage 42 whereupon the end of the lead will engage the tip of rod 70 before the component can engage tip 44. This leaves a precisely determined length of lead between tip 44 and the component. Simply by exerting a transverse force, either mechanical or manual, against the component, the lead inserted in perforation 46 is bent through a desired angle about tip 44 as the bending fulcrum.

In summary, the apparatus of the invention solves the following problem:

If $x$ is the distance between mounting points, $y$ the axial dimension of the component, and $z$ the length of the lead, then for proper mounting the lead is to be bent at a point which is a distance equal to $$z-\left(\frac{x-y}{2}\right)$$

away from the end of the lead. The trammel point settings feed $x$ and $y$ into the device in proper relation, i.e.

$$\frac{x-y}{2}$$

because of the differential construction of the adjusting screw and traveling nut. The adjustment of the chuck determines the value of $z$ to provide a complete solution.

Because the trammel points protrude through slot 32 they might be the source of injury to careless workers when in use and further are susceptible to damage. Consequently, an operator of the device need only grasp fixed nut 58 and rotate same to protect the trammel points. The rotation of fixed nut 58 is accompanied by the rotation of the entire receiver which swings the trammel points through an approximate semicircle into proximity with handle 20. In the preferred embodiment a portion of handle 20, as shown in FIG. 1, is provided with scale 80 which may be calibrated or divided in any manner desirable. Scale 80 is so disposed that when the trammel points are rotated into proximity with the handle, they lie alongside the scale. Thus the component gauge or distance between mounting points, as the case may be, can be readily read off by direct comparison of the distance between the trammel points against the scale.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. An apparatus for providing bend coordinates for so bending leads of an axial lead component that said component is accurately mountable between a pair of mounting points, said apparatus comprising in combination (*a*) an elongated element for holding at least a part of one of said leads within a longitudinal portion thereof and having a section thereof over which a portion of said lead is bendable;

(*b*) adjustable means for measuring the axial dimension of said component and for measuring the distance between said mounting points; and (*c*) means responsive to the measurements effected by said adjustable means for so setting the longitudinal dimension of said portion of said element as to limit the maximum length of the part of said lead holdable therein to an amount substantially equal to the total length of said lead less approximately one-half of the difference between said axial dimension and said distance.

2. An apparatus for providing bend coordinates for so bending leads of an axial lead component that said component is accurately mountable between a pair of mounting points, said apparatus comprising, in combination:

(*a*) an elongated element having an opening therein extending longitudinally thereof for holding at least a part of one of said leads and having a section thereof over which a portion of said lead is bendable out of alignment with respect to the longitudinal axis of said opening;

(*b*) mounting means;

(*c*) said elongated element being mounted on said mounting means for movement substantially along said longitudinal axis;

(*d*) adjustable means mounted on said mounting means and being positionable with respect thereto in accordance with the axial dimension of said component and with the distance between said mounting points; and (*e*) means coupled to said adjustable means for movement therewith, and having a portion extending into said opening for limiting the longitudinal dimension of said opening with respect to the positioning of said adjustable means.

3. An apparatus for providing bend coordinates for so bending leads of an axial lead component that the latter is accurately mountable between a pair of mounting points, said apparatus comprising, in combination:

(*a*) an elongated element for holding at least a part of one of said leads and having a section thereof over which a portion of said lead is bendable;

(*b*) adjustable means for measuring the axial dimension of said component;

(*c*) means responsive to the measurement of said axial dimension of said component for providing a limit to the length of the part of said lead held by said elongated element, said elongated element being movable to a position at which the full length of said lead is held therein from said limit; and (*d*) said adjustable means being movable for measuring the distance between said mounting points and for changing said limit in accordance with the latter measurement by an amount substantially equal to one-half of the difference between said axial dimension and said distance.

4. An apparatus for providing bend coordinates for so bending leads of an axial lead component that the latter is accurately mountable between a pair of mounting points, said apparatus comprising, in combination:

(*a*) support means;

(*b*) an elongated chuck mounted on said support means for movement along its long axis and having a passage therein directed substantially along said axis for holding at least a part of said lead;

(*c*) an element having a portion thereof extending into said passage and being movable for adjustably limiting the length of said passage;

(*d*) first means mounted on said support means and being adjustable in accordance with the axial dimension of said component;

(e) second means responsive to the adjustment of said first means for setting said element at a predetermined position;

(f) third means adjustable in accordance with the distance between said mounting points; and (g) said first means being movable for changing said position of said element by a distance substantially equal to one-half of the difference between said axial measurements and said distance between mounting points responsively to the adjustment of said third means.

5. An apparatus for providing bend coordinates for so bending leads of an axial lead component that the latter is accurately mountable between a pair of mounting points, said apparatus comprising, in combination:

(a) an elongated support means;

(b) an elongated chuck mounted on said support means for movement substantially along the long axis of said support means and having a passage therein directed substantially parallel to said long axis;

(c) a rod having a portion thereof extending into said passage, said portion being movable along said passage for adjustably limiting the length of the latter;

(d) a differential lead screw rotatably mounted on said support means for linear movement substantially parallel with said passage, and being so coupled to said rod that said portion of the latter is movable along said passage responsively to linear movement of said screw;

(e) a first measuring means mounted on and extending from said support means in fixed relation thereto;

(f) a second measuring means mounted on and extending from said lead screw, and being movable substantially parallel to said long axis and in the same direction as said rod responsively to rotation of said screw.

6. An apparatus for providing bend coordinates for so bending leads of an axial lead component that the latter is accurately mountable between a pair of mounting points, said apparatus comprising in combination:

(a) a substantially hollow elongated element;

(b) an elongated chuck mounted within and adjacent one end of said element for sliding movement substantially along the long axis of said element; said chuck having a passage therein disposed substantially parallel with said long axis;

(c) a rod having a portion thereof extending into said passage said portion being movable along said passage for adjustably limiting the length of the latter;

(d) an elongated screw having a righthand set of threads and a lefthand set of threads on separate portions thereof;

(e) said screw being mounted for rotation internally of said element adjacent the opposite end thereof with one of said sets in threaded engagement therewith, said screw being disposed for advancement linearly and substantially parallel to said long axis upon rotation;

(f) said rod being so coupled to said screw that said rod is movable along said passageway responsively to linear movement of said screw;

(g) a first measuring means mounted on and extending from said element adjacent said opposite end and in fixed relation thereto;

(h) a second measuring means mounted on the other set of threads for linear movement substantially parallel to said long axis and in the same direction as said rod responsively to rotation of said screw.

7. An apparatus as defined in claim 6 including an elongated handle, and wherein said element is so mounted along the length of said handle as to be rotatable about said long axis.

8. An apparatus as defined in claim 6 wherein:

(a) said element includes a longitudinal slot therein;

(b) said first measuring means comprises a pointed post extending substantially perpendicularly to said long axis and outwardly of said element; and (c) said second measuring means comprises a threaded member in threaded engagement with said other set and a pointed post mounted thereon and extending substantially perpendicularly to said long axis and outwardly of said element through said slot.

References Cited in the file of this patent

UNITED STATES PATENTS

| | | |
|---|---|---|
| 1,703,736 | Jacob | Feb. 26, 1929 |
| 2,415,821 | Hoffman | Feb. 18, 1947 |
| 2,824,475 | Rolando | Feb. 25, 1958 |

OTHER REFERENCES

Publication: Popular Mechanics, page 218, vol. 109, No. 3, March 1958.